United States Patent [19]

Gottlieb

[11] 4,196,791

[45] Apr. 8, 1980

[54] SPEAKER GRILL INCLUDING STRESS REGIONS

[75] Inventor: Ellis J. Gottlieb, Ft. Lauderdale, Fla.

[73] Assignee: Motorola, Inc., Schaumburg, Ill.

[21] Appl. No.: 867,655

[22] Filed: Jan. 6, 1978

[51] Int. Cl.[2] ........................ H05K 5/00; G10K 11/00

[52] U.S. Cl. .................................... 181/155; 181/149; 181/171; 181/175

[58] Field of Search ............... 181/155, 149, 175, 171, 181/199, 159, 157, 158; 179/184, 1 E

[56] References Cited

U.S. PATENT DOCUMENTS

| | | | |
|---|---|---|---|
| 3,108,654 | 10/1963 | Hammes | 181/175 |
| 3,716,671 | 2/1973 | Karr | 181/150 |
| 3,731,760 | 5/1973 | Hammes | 181/199 |
| 3,909,530 | 9/1975 | Gosswiller | 181/175 |
| 3,938,618 | 2/1976 | Ambruoso, Sr. | 181/155 |
| 3,989,909 | 11/1976 | Hodsdon et al. | 181/175 |

*Primary Examiner*—Stephen J. Tomsky
*Attorney, Agent, or Firm*—Donald B. Southard; James W. Gillman

[57] ABSTRACT

The speaker grill is a part of a molded plastic member which may form a wall of housing for a device which includes an audio transducer. The plastic member includes provisions for supporting the audio transducer adjacent the grill, which has openings for the transmission of sound. The grill has stress regions in which there are no openings, which are in tension when the grill is flexed to thereby increase the strength of the grill. The stress regions may extend across the grill in an "X" pattern, or in any other pattern wherein one of a plurality of such regions extends transversely with respect to another region. The openings for sound transmission may be slots extending from the sides of grooves, which form labyrinth openings so that there is no direct passage through the grill, thereby tending to prevent entry of undesired objects.

2 Claims, 4 Drawing Figures

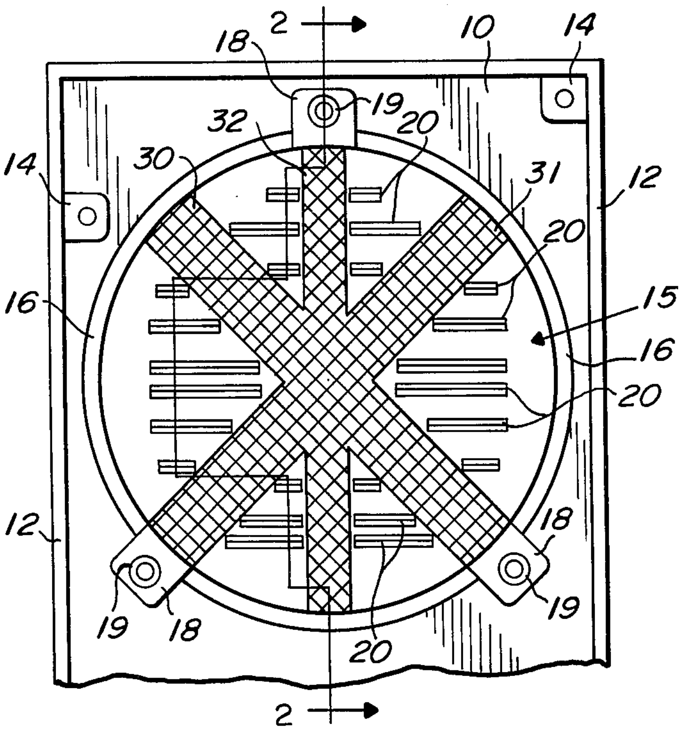
Fig. 1
Fig. 2
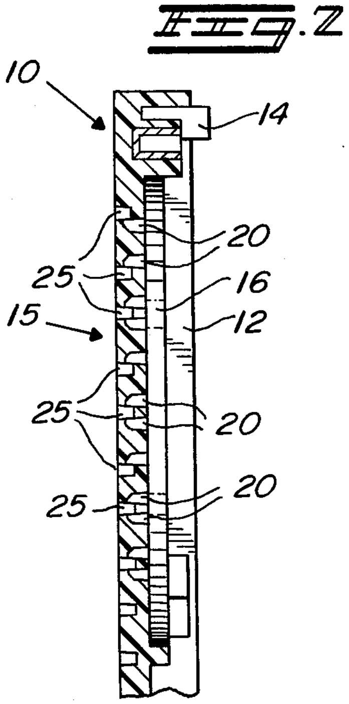
Fig. 3
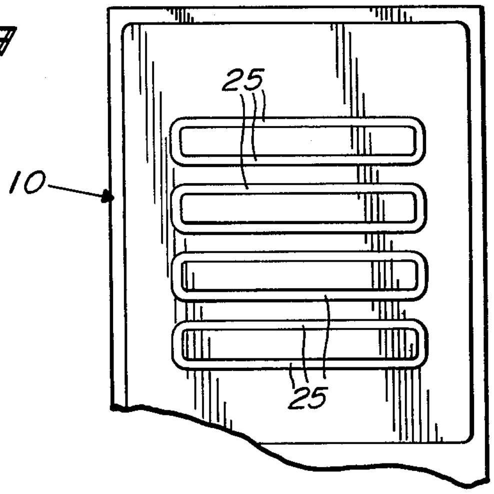
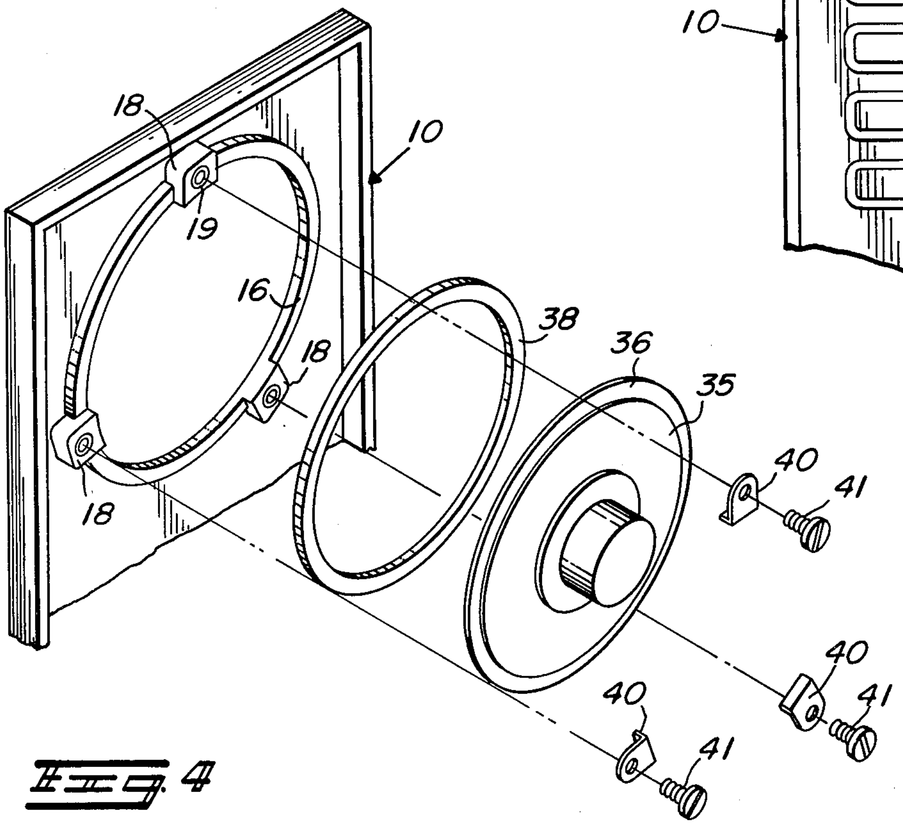
Fig. 4

SPEAKER GRILL INCLUDING STRESS REGIONS

BACKGROUND OF THE INVENTION

Small electronic devices, such as hand-held radio and paging devices, include a sound transducer within the housing for converting electrical signals into sound, or vice versa. Such devices have a grill in the housing for passage of sound from the transducer to the user of the device and/or from the outside of the housing to the transducer. In order to provide an inexpensive device, it is common practice to use molded housings with the grill molded therein. However, the openings in the grill weaken the molded housing and tend to permit entry of foreign objects. This is objectionable, particularly in portable devices which are subject to rough usage, as a force applied to the grill may fracture the housing. To overcome this, it has been proposed to provide heavy cross ribs on the grill, or other reinforcement, but this utilizes additional space and increases the cost. The known structures have not been satisfactory in many applications, particularly for miniature devices such as hand-held or pocket-type radio and paging devices.

SUMMARY OF THE INVENTION

It is an object of this invention to provide an improved molded plastic grill for a miniature device which includes an audio transducer.

Another object is to provide a molded speaker grill which includes stress regions therein for strengthening the grill.

A further object is to provide a plastic member which may form a part of a housing which has a grill with stress regions extending transversely thereacross, and labyrinth openings for sound passage in parts of the grill other than the stress regions.

A still further object of the invention is to provide a molded plastic member for supporting an audio transducer, having a grill adjacent the transducer for passage of sound, with imperforate stress regions extending across the grill for strengthening the plastic member.

The speaker grill of the invention is formed by a molded plastic member having openings therein for transmission of sound. An audio transducer can be mounted against the grill within a rim molded thereon. The molded grill has stress regions therein extending from one section of the rim to an opposite section. At least two stress regions extend transversely with respect to each other, as in an "X" configuration, and these regions are in tension when the grill is flexed. The stress regions have no openings therein so that they have substantial tensile strength to thereby resist fracture of the plastic grill. The openings are provided by grooves in the front side of the grill and slots opening into the sides of the grooves, forming labyrinths which tend to prevent passage of foreign matter through the grill. The grill can be formed as a part of a molded housing for a radio or the like, and results in a housing having greatly increased strength.

BRIEF DESCRIPTION OF THE DRAWINGS

FIG. 1 is a plan view of the speaker grill of the invention;

FIG. 2 is a cross-section view along the line 2—2 of FIG. 1;

FIG. 3 is a front view of the grill of FIGS. 1 and 2; and

FIG. 4 is an exploded view of the grill and an audio transducer to be used therewith.

DETAILED DESCRIPTION OF THE INVENTION

FIGS. 1, 2 and 3 show the speaker grill of the invention which is part of a plastic member 10 which may form a part of a housing for a radio device. The member 10 includes an edge 12 and mounting posts 14 for engagement with other parts of a housing. As shown by FIG. 3, the member 10 may extend below the grill to form the front wall of a vertically elongated housing for a hand-held device. The speaker grill proper is the portion 15 within the circular rim 16, which is adapted to receive the edge of an audio transducer such as a speaker (FIG. 4). Along the rim 16 are three mounting bosses 18 having threaded inserts 19 molded therein for receiving screws for mounting the transducer to the member 10.

The grill 15 has openings 20 therein for the passage of sound from and/or to the audio transducer. As shown by FIG. 2, the openings 20 extend from grooves 25 in the front face of the member 10. FIG. 3 shows that the grooves 25 are arranged to form an attractive pattern. The openings 20 are in the form of slots opening into the sides of the grooves 25 to form labyrinths, as is seen in FIG. 2. That is, the relationship of the openings 20 to the grooves 25 on the opposite side of the grill 10 is such as to effect a stepped through passage, or "labyrinth". This acts to restrict the passage of undesired material through the member 10 into the space adjacent the audio transducer.

The grill portion 15 of the member 10 includes stress regions 30, 31 and 32 which are bands extending thereacross from one section of rim 16 to an opposite section. The regions 30 and 31 form an "X", and the region 32 extends vertically with respect to the "X". These regions have no openings 20 therein, and have greater tensile strength than the parts of the grill 15 in which the openings are located. The member 10 can be molded of any suitable plastic material, such as a polycarbonate plastic. The stress regions may have the same thickness as the remainder of the grill 15, but since these regions are imperforate, they have greater tensile strength and effectively resist fracture of the member 10 when a force is applied to the grill 15 which acts to flex the same.

The configuration of the stress regions can be other than that shown, and it has been found that the two regions 30 and 31 which form the "X" provide adequate strength for a grill in a housing for a small hand-held radio device. Preferably there should be at least two stress regions which extend transversely with respect to each other to provide the required strength to resist forces applied at various points on the grill. In the structure illustrated, the openings 20 cover about 7% of the grill area, as is common practice, but openings covering a larger percent of the grill area could be used, with sufficient area remaining for stress regions which provide the required strength.

FIG. 4 is an exploded view illustrating the mounting of a speaker 35 to the member 10. A resilient ring 38 fits within the circular rim 16, and the circular edge 36 of speaker 35 engages this ring 38. The edge 36 of the speaker 35 is held against the ring 38 by clips 40 which are secured to the bosses 18 by screws 41 threaded into the inserts 19. This provides a secure mounting of the speaker 35 to the member 10, as required for good sound reproduction. The sound from the speaker 35 passes through the openings 20 to the outside of the radio device to be heard by the user of the device.

As is well known, other parts of the radio device can be mounted adjacent to the speaker and below the same, with all being enclosed by the housing to form a compact device. A battery for energizing the device can also be provided in the housing. The provision of the stress regions across the grill substantially increases the strength of member 10 so that the danger of fracture or damage to the plastic housing is greatly reduced.

The speaker grill of the invention has been found to be extremely satisfactory for incorporation in a molded plastic housing for a small device having an audio transducer, such as a hand-held radio. The placement of the sound passages to provide imperforate stress regions greatly increases the strength of the grill. The configuration of the sound passages as labyrinths reduces passage of foreign material therethrough.

What is claimed is:

1. A grill structure for use with an audio transducer including a member molded of plastic material having a sound transmission portion with imperforate bands in the plane of said member and integral therewith and which extend transversely thereacross forming stress regions for strengthening said member, said sound transmission portion having openings therein outside said stress regions, and said member having grooves in one side thereof and slots extending from the other side and opening into the sides of the grooves so as to form labyrinth like openings through said member which tend to prevent entry of undesired material.

2. A grill structure in accordance with claim 1 including means for receiving the audio transducer on one side of said member, and wherein said labyrinth like openings communicate with the audio transducer.

* * * * *